(12) United States Patent
Yamada

(10) Patent No.: US 7,413,686 B2
(45) Date of Patent: Aug. 19, 2008

(54) CONDUCTIVE PARTICLE AND ADHESIVE AGENT

(75) Inventor: Yukio Yamada, Tochigi (JP)

(73) Assignee: Sony Chemicals Corporation, Tokyo (JP)

( * ) Notice: Subject to any disclaimer, the term of this patent is extended or adjusted under 35 U.S.C. 154(b) by 134 days.

(21) Appl. No.: 10/509,204

(22) PCT Filed: Mar. 25, 2003

(86) PCT No.: PCT/JP03/03635

§ 371 (c)(1),
(2), (4) Date: Oct. 31, 2005

(87) PCT Pub. No.: WO03/081606

PCT Pub. Date: Oct. 2, 2003

(65) Prior Publication Data

US 2006/0054867 A1    Mar. 16, 2006

(30) Foreign Application Priority Data

Mar. 25, 2002    (JP)    ............................. 2002-082753

(51) Int. Cl.
*H01B 1/00* (2006.01)
*B32B 5/16* (2006.01)
(52) U.S. Cl. ........................ 252/512; 252/513; 252/514; 428/403; 428/407
(58) Field of Classification Search ................. 427/222; 252/500, 512, 513, 514; 428/403, 407
See application file for complete search history.

(56) References Cited

U.S. PATENT DOCUMENTS

| 6,344,156 | B1 | 2/2002 | Yamada et al. |
| 6,344,272 | B1 * | 2/2002 | Oldenburg et al. ........... 428/403 |
| 2001/0055685 | A1 * | 12/2001 | Kaneyoshi ................... 428/403 |

FOREIGN PATENT DOCUMENTS

| JP | 7-50104 | 2/1995 |
| JP | 8-249922 | 9/1996 |
| JP | 2000-195339 | 7/2000 |
| JP | 2000-306428 | 11/2000 |
| JP | 2001-11503 | 1/2001 |

* cited by examiner

*Primary Examiner*—Mark Kopec
*Assistant Examiner*—Jaison P Thomas
(74) *Attorney, Agent, or Firm*—Frommer Lawrence & Haug LLP; William S. Frommer; Thomas F. Presson

(57) ABSTRACT

A conductive particle can be used for connecting a variety of adherends. The conductive particle includes a resin particle, a first conductive particle disposed around the resin particle, a first resin coating disposed on the periphery of the resin particle. The first resin coating being softer than the resin particle. A second conductive thin film is disposed therearound. When the surface part of an electrode of an adherend that is to be connected is hard, a first resin coating of the conductive particle and the second conductive thin film are destroyed by pressure to bring the second conductive thin film in contact with the electrode and a metal wiring. If the surface part of the electrode is soft, the second conductive thin film on the surface side comes in contact with the electrode, which makes it possible for the particle to be used regardless of the surface state of an adherend.

13 Claims, 5 Drawing Sheets

CONDUCTIVE PARTICLE AND ADHESIVE AGENT

TECHNICAL FIELD

The present invention relates to a conductive particle and an adhesive, especially an adhesive containing conductive particles.

BACKGROUND ART

As regards connection between adherends, for example when various electric devices are produced by connecting a semiconductor chip on a substrate or by connecting a tape carrier package (hereinafter abbreviated to TCP) and a liquid crystal display (hereinafter abbreviated to LCD), it is often executed with an adhesive containing conductive particles.

FIG. 9 shows a schematic cross-sectional view of the main parts of an electric device 101 constructed by bonding an LCD 111 and a TCP 115 with an adhesive 125 containing conductive particles 130.

The TCP 115 is composed of a base film 116, and metal wirings 117 formed in such a manner that they are adhered to the surface of this base film 116.

The LCD 111 has a substrate 112 formed of a glass substrate, and electrodes 113 disposed on the surface of this substrate 112 in such a manner that they face the metal wirings 117 of the TCP 115.

The conductive particles 130 in the adhesive 125 are sandwiched between the electrodes 113 and the metal wirings 117; the electrodes 113 and metal wirings 117 corresponding with each other are electrically connected with those conductive particles 130, and concurrently the LCD 111 and the TCP 115 are mechanically joined with the adhesive 125.

In this manner, the LCD 111 and the TCP 115 are electrically and mechanically connected.

Hereupon, if the electrodes 113 of the LCD 111 are made of a metal that easily oxidizes such as aluminum or chromium, oxide thin films are formed on the surfaces of the electrodes 113 with the natural oxidation of the metal. In this case, if oxide coatings are formed on the surfaces of the electrodes 113, only the conductive particles 130 being sandwiched between the electrodes 113 and the metal wirings 117 renders electrical conduction unreliable. However, if hard particles such as metal particles are used as the conductive particles 130, the reliability of the conductive portion of the electric device 101 increases; because those conductive particles 130 penetrate the oxide coatings on the surfaces of the electrodes 113 in a heating and pressing process, the conductive particles 130 and the electrodes 113 directly touch each other.

However, if the electrodes 113 of the LCD 111, which is an adherend, are soft or the pattern of the electrodes 113 is minute, when hard conductive particles 130 of the above-mentioned kind are used, the substrate 112 and the metal wirings 117 may deform or break in the heating and pressing process.

In addition, metal particles are low in coefficient of linear expansion and modulus of elasticity in comparison with a binder of an adhesive, so that when a binder reacts (recovers from deformation) after finishing the heating and pressing, the contact between the conductive particles 130 and the metal wirings 117 may break.

To connect such adherends with each other, a conductive particle 140 in which a conductive thin film 142 is adhered to the surface of resin particle 141, whose schematic cross-sectional view is shown in FIG. 10, is used.

The resin particle 141 is soft in comparison with metal particles and has approximately the same coefficient of linear expansion as that if a binder in an adhesive.

Therefore, if such conductive particle 140 is used, a soft adherend does not break and the resin particle 141 recovers from deformation along with a binder in an adhesive, so that the contact between the conductive particle 140 and a metal wiring is maintained.

However, since this conductive particle 140 is soft in comparison with conductive particles formed of metal particles, it is possible that if adherends are hard, the resin particle 141 may deform excessively by pressure, a crack may occur in the conductive thin film 142, and so conductive resistance at connecting portions may increase.

Also, if, for example, an oxide coating is formed on an electrode surface with natural oxidation, there may be the case in which the conductive particle 140 can not penetrate the oxide coating, thereby lowering the conductive reliability of the electric device 101.

Thus, it is necessary to change the kind of conductive particles depending on the kind of an adherend, so that it has been difficult to use conductive particles of the same kind for connection between various kinds of adherend.

DISCLOSURE OF INVENTION

The present invention provides a conductive particle and an adhesive capable of resolving the above-mentioned problems in which conductive resistance increases and conductive reliability lowers.

Specifically, the conductive particle according to the present invention includes a resin particle, a first conductive thin film disposed around this resin particle, a first resin coating disposed around the first conductive thin film, and a second conductive thin film disposed around the first resin coating, whose resin that forms the resin particle is harder than resin that forms the first resin coating.

Further, the adhesive according to the present invention is composed of the above-mentioned conductive particles according to the present invention, and a binder containing thermoplastic resin.

Specifically, as described above, the conductive particle in this adhesive includes a resin particle, a first conductive thin film disposed around this resin particle, a first resin coating disposed around this first conductive thin film, and a second conductive thin film disposed around this first resin coating, whose resin that forms the resin particle is harder than resin that forms the first resin coating.

According to the above-mentioned conductive particle of the present invention, regardless of an adherend being hard or soft, connection between adherends can surely and favorably be made in the state in which the conductive particle exists and is pressed between the adherends.

Specifically, in the case where adherends are hard, when the first resin coating is first deformed by pressure, the second conductive thin film on this resin coating is destroyed; with further pressure, the first conductive thin film is exposed due to the destruction of the first resin coating, and with the first conductive thin film, electrical connection between the adherends takes place.

On this occasion, the resin particle being hard, the first conductive thin film can be brought in contact with the adherends in a favorable manner.

Further, in the case where adherends are soft, the first resin coating hardly deforms, so that the second conductive thin film is not destroyed, and therefore this makes electrical connection between the adherends take place.

Furthermore, the adhesive according to the present invention, in which the conductive particle of the present invention is used, is capable of obtaining reliable electrical connection and mechanical joining by working together with a binder, as well as capable of making electrical connection take place between adherends in a favorable manner as described above.

BEST MODE FOR CARRYING OUT THE INVENTION

Figure 1A:
FIGS. 1A to 1D are schematic cross-sectional views of an example of a conductive particle according to the present invention in a production process.

As described above, a conductive particle according to the present invention basically includes a resin particle, a first conductive thin film disposed around the resin particle, a first resin coating disposed around the first conductive thin film, and a second conductive thin film disposed around the first resin coating, whose resin that forms the resin particle is harder than the resin that forms the first resin coating.

It is desirable that the thickness of the first resin coating be 1/20 to 6 times the diameter of the resin particle, and also the conductive particle be 0.1 µm or more.

This is because if the thickness of the first resin coating is less than one-twentieth the diameter of the resin particle, deformation is not sufficient when an adherend is connected, for example, to an adherend without a hard oxide film of high resistance on the surface of an electrode, which may lower the reliability of the connection; also, if the thickness of the first resin coating is more than 6 times the diameter of the resin particle, the first resin coating can not be penetrated when the above-mentioned oxide film or the like is provided, which may cause contact failure between the first conductive film and adherend.

Also, the thickness of the second conductive thin film can be 0.05 µm or more and 0.3 µm or less.

This is because if the film thickness is less than 0.05 µm, the resistance of the second conductive thin film may increase, and if the film thickness is more than 0.3 µm, cohesion easily arises, which may hinder stable operation at the first resin coating.

In addition, a second resin coating can further be formed around the second conductive thin film.

The above-mentioned first and second conductive thin films can be formed of either or both of nickel and gold.

Further, those first and second conductive thin films can be composed of a nickel coating, and a gold coating formed on the surface thereof.

As regards the above-mentioned conductive particle, the following constitution is possible: as to the first and second conductive thin films, the sum of the weight of the first conductive thin film and the weight of the second conductive thin film is equal to or more than 40% of the weight of the whole of the conductive particle; and in addition, the thickness of the first conductive thin film is one-hundredth or more and half the size or less of the diameter of the resin particle and the thickness of the second conductive thin film is 0.05 µm or more and 0.3 µm or less.

This is because: if the first and second conductive thin films weigh less than 40% of the weight of the whole of the conductive particle, reliability of an electrical connection to an electrode where the above-mentioned oxide film is formed can not be obtained sufficiently; also, if the thickness of the first conductive thin film is less than one-hundredth the diameter of the resin particle, the resistance of the first conductive thin film becomes large and if the thickness of the first conductive thin film is more than half the diameter of the resin particle, cohesion may occur when this first conductive thin film is formed by, for example, plating or the like.

Also, it is possible to form a convex portion on the surface of the first conductive thin film on the side where the first resin coating is formed.

Providing at least one convex portion for each conductive particle when the electrical connection is intended, the conductive particle is pressed against, for example, an electrode of an adherend with the convex portion existing therebetween, so that it is possible to make electrical connection take place surely with a function of the convex portion, for example the effectiveness of penetrating an oxide whose electrode surface is hard.

Regarding this convex portion, it is more desirable that there be five or more on average.

The average height of the convex portion can be 0.05 µm or more in a conductive particle.

Further, an adhesive according to the present invention is constructed in such a manner that a binder containing thermoplastic resin, and the above-mentioned conductive particles of the present invention are dispersed.

The K value at the time the resin that forms the resin particle of the conductive particle according to the present invention is pressed and deforms by 10% is larger than that at the time the resin that forms the first resin coating is pressed and deforms by 10%, and also the breaking strength of the resin that forms the resin particle is greater than that of the resin that forms the first resin coating. Therefore, the resin particle is harder than the first resin coating.

Note that as described in Japanese Published Examined Patent Application No. 7-95165, the K value is the compressive elasticity modulus at the time a substance intended for measurement (the resin of the resin particle or the resin of the first resin coating) is pressed and deforms by 10%, and is shown with the following equation (1).

$$K=(3/\sqrt{2}) \cdot F \cdot S^{-3/2} \cdot R^{-1/2} \text{ (unit: kgf/mm}^2\text{)} \qquad (1),$$

wherein F indicates the load value (kgf) at the time a substance intended for measurement is pressed and deforms by 10%, S indicates the compressive deformation (mm$^2$) at the time a substance intended for measurement is pressed and deforms by 10%, and R indicates the radius (mm) of a substance intended for measurement, respectively.

Also, in the present invention, the breaking strength means the load (unit: gf) when a minute compression testing machine produced by Shimadzu Corporation is used and a measured sample bursts (bursts by pressure) when given a load limited by a set load.

If the conductive particle according to the present invention is disposed between adherends, for example electrodes, and the adherends are pressed, the soft first resin coating in the conductive particle deforms by pressure. If at least the surface parts of the electrodes are hard, the first resin coating deforms greatly by pressure, so that the first resin coating and the second conductive thin film formed on the surface thereof are destroyed to make the first conductive thin film contact with each electrode.

On this occasion, the resin particle does not deform greatly by pressure due to its hardness, and the first conductive thin film on the surface of the resin particle is therefore not destroyed.

Further, if hard oxide coatings are formed on the electrode surfaces, the conductive resistance of an electric device obtained becomes low, because the oxide coatings are penetrated by the first conductive thin film under pressure and so the electrodes and the first conductive thin film directly contact with each other.

On the other hand, in the case where the conductive particle is sandwiched between electrodes, at least whose surface parts are soft, the first resin coating deforms if pressed by a smaller load than in the case of hard electrodes; however the extent of the deformation is small and the first conductive thin film is therefore not destroyed. On this occasion, the load on the electrodes is decreased due to the soft first resin coating, so that the adherend and the electrodes are not deformed or destroyed.

As explained above, the conductive particle according to the present invention can be used for the connection between a variety of adherends (electrodes).

If K value of the resin particle is 100 kgf/mm$^2$ or more and 2000 kgf/mm$^2$ or less, and also the breaking strength thereof is 0.5 gf or more and 10 gf or less, it is possible for the resin particle to penetrate hard oxide coatings when the conductive resin particle is pressed against electrodes.

If K value of the first resin coating is 50 kgf/mm$^2$ or more and 500 kgf/mm$^2$ or less, and also the breaking strength thereof is 0.1 gf or more and 3 gf or less, the first resin coating is destroyed in the case of hard electrodes, however not destroyed in the case of soft electrodes.

It should be noted that the resin particle and the first resin coating are formed of a resin in which no chemical reaction such as polymerization is brought about by heating, so that the K values and the breaking strength of the resin particle and the first resin coating do not change when the heating and pressing are executed with the conductive particle sandwiched between electrodes.

Also, if a second resin coating made of insulative resin is formed on the surface of the second conductive thin film, the conductive reliability of an electric device obtained becomes higher, because even if the conductive particle is brought in contact with both wirings that are next to each other, a short circuit does not occur therebetween.

Embodiments of the present invention are to be explained referring to the figures; however, note that the present invention is not limited to those embodiments.

First, an example of a conductive particle according to the present invention is explained together with the production method thereof, referring to schematic cross-sectional views of respective processes in FIG. 1.

As shown in FIG. 1A, a resin particle 31 is made.

Figure 1B:
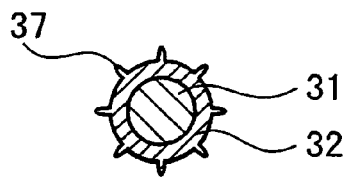

As shown in FIG. 1B, a first conductive thin film 32 is attached to the surface of the resin particle 31 by means of plating. A plurality of convex portions 37 are dispersedly formed on the surface of this first conductive thin film 32.

Figure 1C:
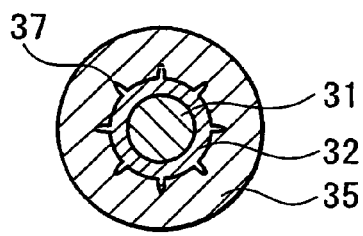

As shown in FIG. 1C, a first resin coating 35 is formed on the surface of the first conductive thin film 32. This first resin coating 35 is formed of a resin that is softer than the resin that forms the resin particle 31, and the thickness thereof is 0.5 µm or more and 5 µm or less. The thickness of the first resin coating 35 is greater than the height of the convex portions 37, and the surface of the first conductive thin film 32 and the convex portions 37 are all covered with the first resin coating 35.

Figure 1D:
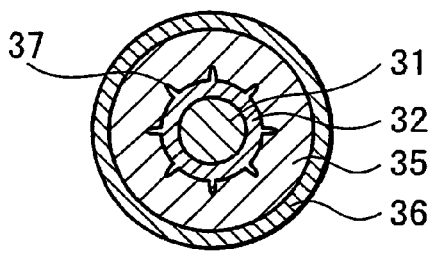

As shown in FIG. 1D, a second conductive thin film 36 is formed on the surface of the first resin coating 35 by means of plating. In this manner, a conductive particle 30 according to the present invention is constructed.

By dispersing and mixing the conductive particles 30, each of which has the above construction, in a binder whose main component is thermoplastic resin, a paste-like adhesive is produced, for example.

Referring to FIG. 2, an example of a case in which an adhesive film formed of this adhesive is produced is explained.

Figure 2A:
FIGS. 2A and 2B are schematic cross-sectional views of an example of producing an adhesive film in a production process using an adhesive according to the present invention.

As shown in FIG. 2A, a removable film 21 is prepared.

Figure 2B:
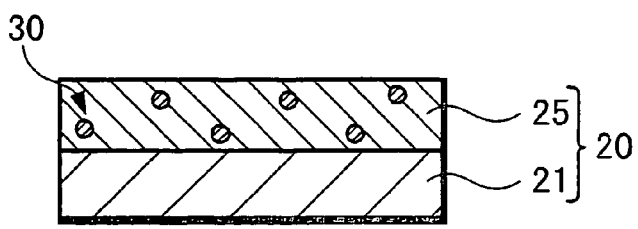

As shown in FIG. 2B, a predetermined amount of paste-like adhesive is applied to the surface of the removable film 21 and then dried to form an application layer 25 of the adhesive. In this manner, an adhesive film 20 in which the application layer 25 of the adhesive is formed on the removable film 21 is constructed.

Figure 3A:
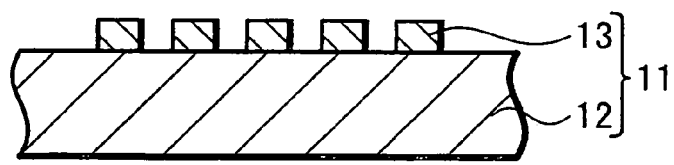
FIGS. 3A to 3D are schematic cross-sectional views of an example in the first half of a production process, in which an LCD and a TCP are connected using an adhesive of the present invention.
Figure 3B:
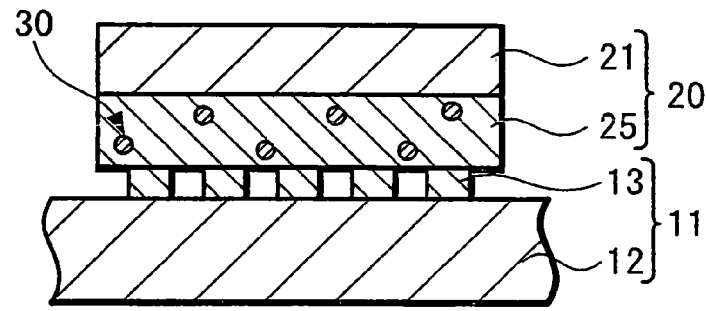
Figure 3C:
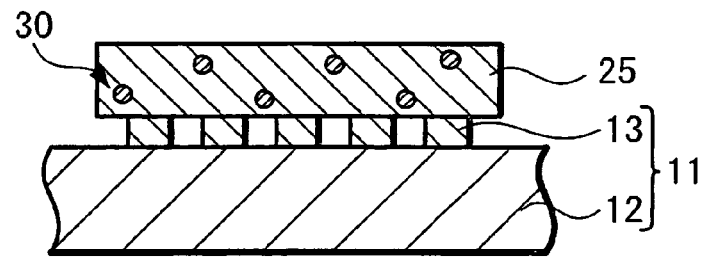
Figure 3D:
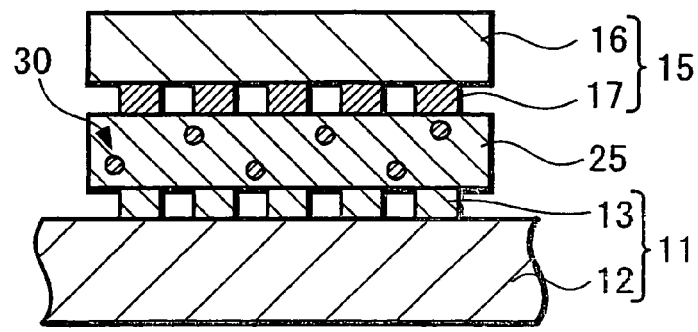
Figure 4:
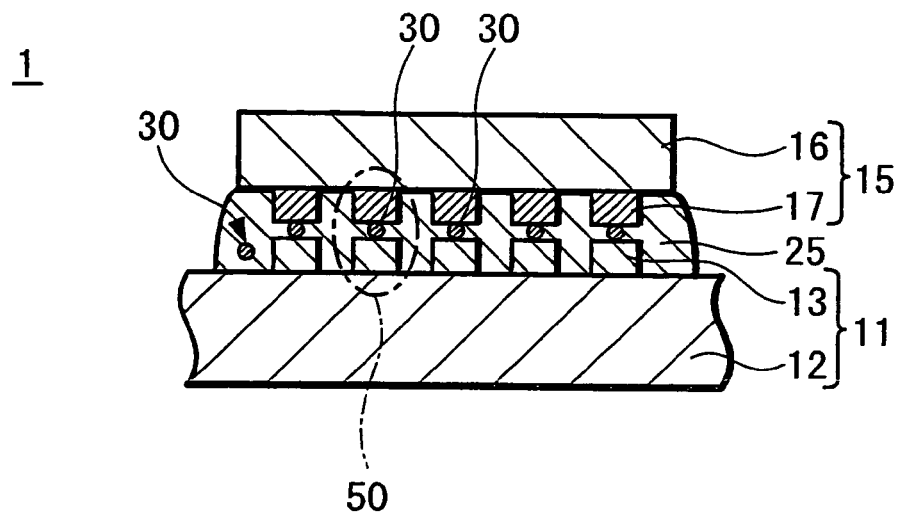
FIG. 4 is a schematic cross-sectional view of an example in the latter half of a production process, in which an LCD and a TCP are connected using an adhesive according to the present invention.

Next, referring to FIGS. 3 and 4, an example of a case in which an LCD 11 and a TCP 15 are connected using the adhesive film 20 is explained.

As shown in FIG. 3A, the LCD 11 is constructed in such a manner that electrodes 13, which are to be connected to metal wirings of a TCP, are formed on the surface of a substrate 12 where an LCD has been formed. Those electrodes 13 are disposed at positions corresponding with later described metal wirings of the TCP.

As shown in FIG. 3B, the application layer 25 of the aforementioned adhesive film 20 is pressed against the LCD 11 aligned with the electrodes 13 on the substrate 12.

In this state, the removable film 21 of the adhesive film 20 is exfoliated as shown in FIG. 3C. As to this exfoliation, since the adhesion of the removable film 21 to the adhesive's application layer 25 is small enough in comparison with the adhesion of the adhesive's application layer 25 to the substrate 12 and the electrodes 13 thereon, the exfoliation can be executed such that the application layer 25 remains on the substrate 12, with the adhesive's application layer 25 firmly attached to the electrodes 13.

Subsequently, as shown in FIG. 3D, the TCP 15 is mounted on the LCD 11 with the above-mentioned adhesive's application layer 25 in between.

This TCP 15 is constructed with metal wirings 17 being formed on a base film 16. Then, the TCP 15 is superimposed such that the metal wirings 17 thereof face the corresponding electrodes 13 of the LCD 11 which are to be connected to the metal wirings 17, with the adhesive's application layer 25 in between.

In this state, the TCP 15 and the LCD 11 are pressed against each other. With such pressing, heat is applied.

By doing this, as shown in FIG. 4, the application layer 25 is heated and softens; the metal wirings 17 push the softening application layer 25 aside; and the conductive particles 30 in the remaining application layer 25 are brought in contact with the metal wirings 17 and the electrodes 13 and are sandwiched therebetween.

Thus, as described later on, the metal wirings 17 of the TCP 15 and the electrodes 13 of the LCD 11 are connected by the first conductive thin films 32 or second conductive thin films 36 of the conductive particles 30 to form an electric device 1. Then, the LCD 11 and the TCP 15 are also mechanically connected as thermoplastic resin in the application layer 25 is polymerized by heating and so the application layer 25 is hardened.

Figure 5:
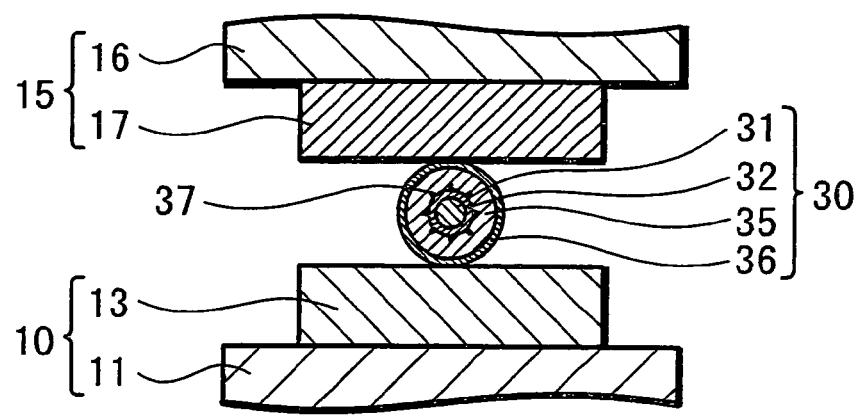
FIG. 5 is a schematic cross-sectional view showing a state in which a conductive particle according to the present invention is sandwiched between an electrode and a metal wiring.

FIG. 5 is an enlarged cross-sectional view of a part at which the conductive particle 30 is sandwiched between the metal wiring 17 and the electrode 13, which is shown with the broken line 50 in FIG. 4.

In this state, the second conductive thin film 36 of the conductive particle 30 is in contact with both the electrode 13 and the metal wiring 17, which are facing each other, to be electrically connected.

However, the connected state between the electrode 13 and the metal wiring 17 with the conductive particle 30 differs depending on whether the surface part of the electrode 13 is hard or soft.

Figure 6A:
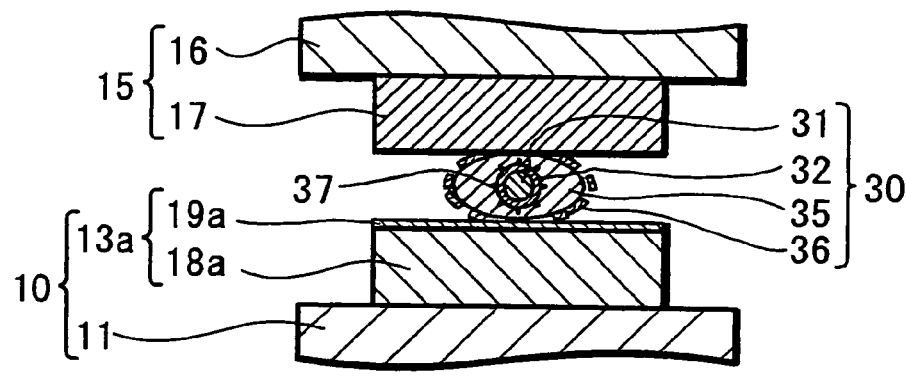
FIGS. 6A to 6C are schematic cross-sectional views showing a conductive particle deformed in the case where the surface part of an electrode is hard.
Figure 6B:
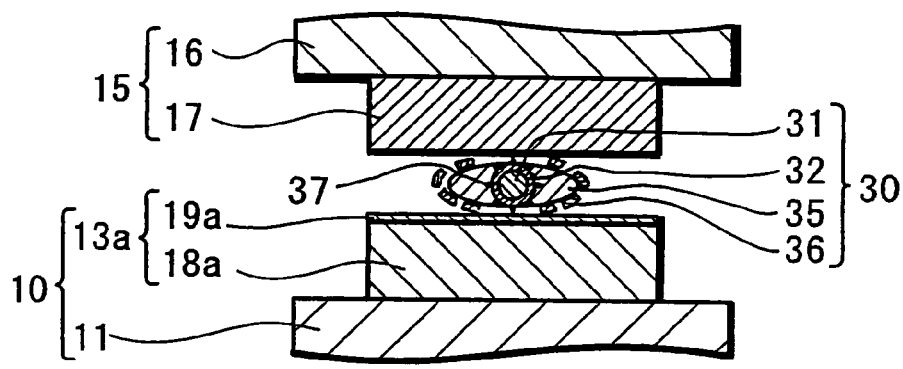
Figure 6C:
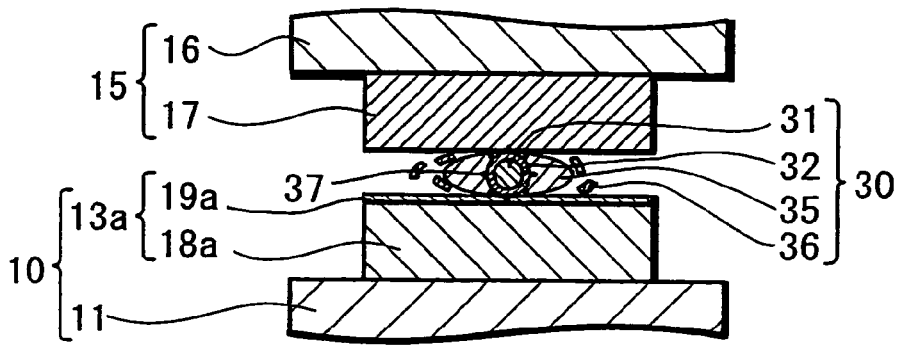

First, referring to FIGS. 6A to 6C, the case in which the surface part of the electrode 13 is hard is explained.

Specifically, in FIG. 6, the case in which the electrode 13 is a hard electrode 13a, that is, made of aluminum, for example, and the natural oxidation of the surface has caused an oxide coating 19a to form on the surface of an electrode body 18a is shown.

In this case, the oxide coating 19a being hard, the first resin coating 35 of the conductive particle 30 sandwiched between the oxide coating 19a and the metal wiring 17 deforms by the above-mentioned pressure, and as shown in FIG. 6A, the second conductive thin film 36 on the surface of the first resin coating 35 is destroyed.

If the pressing is continued further, the first resin coating 35 deforms further by pressure, and the film thickness thereof becomes thinner at the parts contacting with the oxide coating 19a and the metal wiring 17.

The thin parts of the first resin coating 35 are penetrated by the first conductive thin film 32, and are penetrated even more excellent if the convex portions 37 are formed as in this example, and the first conductive thin film 32 is brought in contact with both the metal wiring 17 and the oxide coating 19a as shown in FIG. 6B.

On this occasion, the resin particle 31 being hard, the extent of the deformation of the resin particle 31 by pressure is small; the resin particle 31 and the first conductive thin film 32 on the surface thereof do not break; the oxide coating 19a of the electrode 13a is penetrated by, for example, the convex portions 37 of the first conductive thin film 32, and so the first conductive thin film 32 comes in direct contact with the electrode body 18a as shown in FIG. 6C. Accordingly, the metal wiring 17 and the electrode body 18a are electrically connected with the first conductive thin film 32 in between.

Figure 7:
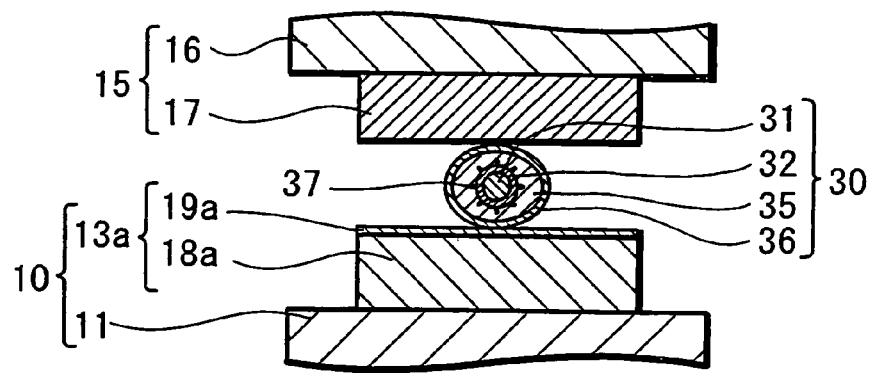
FIG. 7 is a schematic cross-sectional view showing a conductive particle according to the present invention deformed in the case where the surface part of an electrode is soft.

Next, referring to FIG. 7, the case in which the electrode 13 is an electrode 13b whose surface part is soft is explained. The electrode 13b is composed of, for example, an electrode body 18b made of copper and a gold-plated coating 19b formed on the surface of the electrode body 18b.

In this case, the first resin coating 35 deforms by pressure, however the extent of the deformation is small because the gold-plated coating 19b is soft in comparison with the oxide coating 19a; and the second conductive thin film 36 on the surface of the first resin coating 35 is not destroyed either, so that the electrode 13b and the metal wiring 17 are electrically connected through the second conductive thin film 36.

On this occasion, since the load on the electrode 13b by pressure is reduced by the first resin coating 35 deforming, the electrode 13b does not deform or break.

It should be noted that although a case in which the second conductive thin film 36 is exposed on the surface of the conductive particle 30 was explained in the above-mentioned example, the present invention is not limited thereto.

Figure 8:
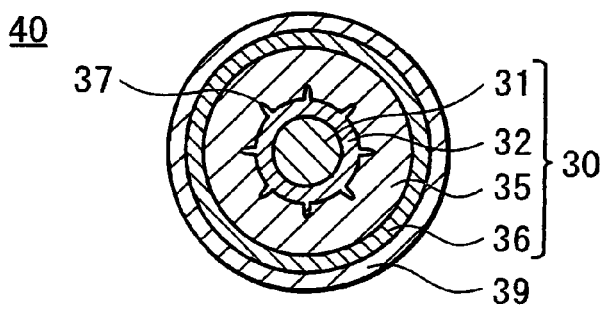
FIG. 8 is a schematic cross-sectional view of another example of a conductive particle according to the present invention.
Figure 9:
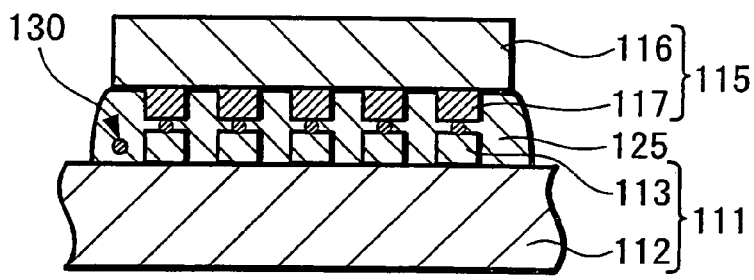
FIG. 9 is a schematic cross-sectional view showing an electric device produced using a conventional adhesive.
Figure 10:
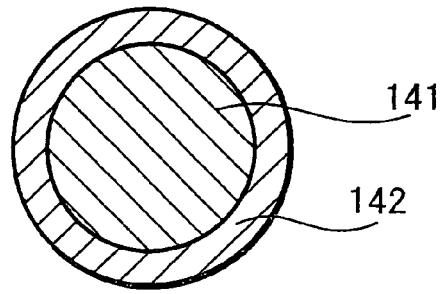
FIG. 10 is a schematic cross-sectional view of an example of a conductive particle used for a conventional adhesive.

For example, as shown in FIG. 8, a conductive particle 40 in which the surface of the conductive particle 30 produced in the process shown in FIGS. 1A to 1D is additionally covered with a second resin coating 39 made of insulative resin can be considered.

The conductive particle 40 is covered with the insulative second resin coating 39, so that even if the conductive particle 40 comes in contact with electrodes that are next to each other, a short circuit does not occur between those electrodes. However, the crush caused by pressing the TCP 15 and the LCD 11 as described above makes this second resin coating 39 recede to expose the second conductive thin film 36 between the metal wiring 17 and the opposing electrode 13, so that the first conductive thin film 32 is brought in contact with the metal wiring 17 and the electrode 13 to be electrically connected as in FIG. 5 or by an operation similar to that shown in FIG. 6.

Further, in the above-mentioned example at least one convex portion 37 is formed on the surface of the first conductive thin film 32, and in this case the oxide coating 19a can be destroyed efficiently; the present invention is not limited thereto, and an operation based on the operation explained in FIG. 6 can be obtained in the case where there are no convex portions formed on the surface of the first conductive thin film 32 as well.

Further, in the above-mentioned example the electric device 1 is produced using the adhesive film 20 in which the application layer 25 of the adhesive containing the conductive particles is formed on the removable film 21; the present invention is not limited thereto, and it is possible to form an application layer by applying a liquid adhesive to the surface of an adherend and then by bonding another adherend to this application layer's surface, for example.

Further, the convex portions 37 on the surface of the first conductive film 32 can be constructed by plating, an adhesion method, and so on.

As plating, for example, a method can be employed in which when the first conductive thin film 32 is formed by means of electroless plating, concurrently the convex portions 37 are formed on the surface thereof by controlling various conditions such as temperature, concentration, and the like.

Further, an adhesion method is the one in which after resin (for example, acrylic styrene resin) is attached to the surface of the first conductive thin film 32, it is stirred in a hybridization device along with metal fine particles such as Ni (nickel) particles, and the metal fine particles are attached to the surface of the first conductive thin film 32 through the resin to form the convex portions 37.

However, the formation of the convex portions 37 is not limited to such methods.

Next, practice examples of conductive particles according to the present invention are explained in detail along with comparative examples.

PRACTICE EXAMPLE 1

In this practice example the above-mentioned conductive particle 30 was produced.

In this case, first of all, a resin particle 31 of 2 μm in diameter was produced using a resin made of a divinylbenzene polymer whose K value is 600 kgf/mm$^2$ and breaking strength 3.2 gf at the time when pressed and deforms by 10%. Next, after a nickel coating of 0.15 μm in thickness was formed on the surface of the resin particle 31 by means of plating, a gold coating of 0.02 μm in thickness was formed on the surface of the nickel coating by means of plating, and a first conductive thin film 32 composed of the nickel coating and the gold thin film was formed. There were no convex portions formed on the surface of the first conductive thin film 32.

Then, a powdery resin material made of an acrylic resin, whose K value by 10% is 300 kgf/mm$^2$ and breaking strength 1.3 gf at the time when pressed and deforms, was used; this resin material, and the resin particle 31 on which the first conductive thin film 32 was formed were mixed in a hybridization device; and further a resin material was electrostatically attached to the surface of the first conductive thin film 32 formed on the resin particle 31. After that, the resin particle 31 to which the resin material was electrostatically attached was agitated; dissolving the resin material to be integrated; and a first resin coating 35 of 2 μm in thickness was formed on the first conductive thin film 32.

Subsequently, a second conductive thin film 36 is formed on the surface of the first resin coating 35 on the same condition as that of the first conductive thin film 32 to obtain a conductive particle 30.

PRACTICE EXAMPLE 2

In this practice example the aforementioned conductive particle 40 was produced.

In this case, first, a conductive particle 30 was produced by a similar method to the practice example 1. Then, a second resin coating 39 of 0.1 μm in thickness made of acrylic styrene resin is formed on the surface of a second conductive thin film 36 of the conductive particle 30 to obtain a conductive particle 40.

As regards each of the above-mentioned conductive particles 30 and 40 of practice examples 1 and 2: when the total weight of the first and second conductive thin films 32 and 36 is divided by the whole weight of each of the conductive particles 30 and 40 and then is multiplied by 100 each to calculate the metal content by percentage (metallization rate) of each of the conductive particles 30 and 40 of practice examples 1 and 2, each metallization rate was 50%.

PRACTICE EXAMPLE 3

In this practice example, a conductive particle 30 was produced by means of a similar method to the practice example 1; however, in this practice example 3, the first conductive thin film 32 was composed of a nickel coating of 0.01 μm in thickness and a gold coating of 0.01 μm in thickness.

PRACTICE EXAMPLE 4

In this practice example, a conductive particle 40 was produced by means of a similar method to the practice example 2 using the conductive particle 30 obtained in the practice example 3.

PRACTICE EXAMPLE 5

In this practice example, a conductive particle 30 was produced by means of a similar method to the practice example 1; however, in this practice example 5, the diameter of a resin particle 31 was 0.5 μm, and the thickness of a first resin coating 35 was 3 μm.

PRACTICE EXAMPLE 6

In this practice example, a conductive particle 40 was produced by means of a similar method to the practice example 2 using the conductive particle 30 obtained in the practice example 5.

PRACTICE EXAMPLE 7

In this practice example, a conductive particle 30 was produced by means of a similar method to the practice example 1; however, in this practice example 7, a first conductive thin film 36 was formed by means of plating, and twelve convex portions 37 per one conductive particle 30 were dispersedly formed.

PRACTICE EXAMPLE 8

In this practice example, a conductive particle 40 was produced by means of a similar method to the practice example 2, using the conductive particle 30 obtained in the practice example 7.

PRACTICE EXAMPLE 9

In this practice example, a conductive particle 30 was produced by means of a similar method to the practice example 1; however, in this practice example 9, the thickness of a first resin coating 35 was 0.1 μm, and the thickness of the first resin coating 35 was one-twentieth the diameter of a resin particle 31.

PRACTICE EXAMPLE 10

In this practice example, a conductive particle 30 was produced by means of a similar method to the practice example 1; however, in this practice example 10, the number of convex portions 37 was two.

PRACTICE EXAMPLE 11

In this practice example, a conductive particle 30 was produced by means of a similar method to the practice example 1; however, in this practice example 11, the number of convex portions 37 was five.

The following "Resistance Test" was carried out with respect to the conductive particles 30 and 40 in the above-mentioned practice examples 1 to 11.

Resistance Test

A liquid binder containing epoxy resin which is a thermoplastic resin (a binder for the anisotropic conductive adhesive, product name [CP8000] produced by Sony Chemicals Corporation, was used here) was prepared, and eight kinds of liquid adhesives were produced by dispersing 5 parts by volume of each of the conductive particles in practice examples 1 to 8 with respect to 95 pts by volume of this binder. Subsequently, those adhesives were applied to the surfaces of the removable films 21 and dried to produce eight kinds of adhesive films 20 explained in FIG. 2B.

On the other hand, an LCD 11 in which electrodes 13 made of an aluminum thin film were formed on a glass substrate 12; and a TCP 15 in which metal wirings 17, each of which was 25 μm in width, were disposed on a base film 16 at intervals of 25 μm (50 μm pitch) were prepared. Then eight kinds of electric devices 1 were produced in the process shown in FIGS. 3A to 3D and FIG. 4, using the LCD 11 and the TCP 15 together with the above-mentioned eight kinds of adhesive films. Additionally, hard oxide coatings 19a were formed on the surfaces of the electrodes 13.

As regards those eight kinds of electric devices 1, by means of the four-terminal method, a stationary current (I) was applied from two metal wirings 17; the voltage drop (V) between the other two metal wirings 17 was measured; and then the resistance R (unit: mΩ) was calculated using the equation V=RI. A case in which the measurement value obtained was less than 20 mΩ was rated as ⊚, a case in which the value was 20 mΩ or more and less than 50 mΩ was rated as ○, a case in which the value was 50 mΩ or more and less than 100 mΩ was rated as Δ, and a case in which the value was 100 mΩ or more was rated as ×. The evaluation results of the above-mentioned conductive resistance test are written together with the metallization rate of each of the conductive particles 30 and 40, in the [LCD] section of [Resistance Test] on Chart 1 made below.

Resistance Test on ITO Glass

The value of the resistance R was calculated on the same condition as [Conductive Resistance Test], and the measurement value obtained was evaluated on the same condition as [Conductive Resistance Test], except that an ITO (indium tin oxide) glass substrate where electrodes (ITO electrodes) made of an ITO thin film were formed on the surface thereof was used instead of the LCD 11. It should be noted that since the ITO thin film is softer than the above-mentioned oxide coating 19a, the ITO electrodes are softer than the electrodes 13 of the LCD 11 at their surface parts.

The result is written in the [ITO Substrate] section of [Resistance Test] on Chart 1 made below.

TABLE 1

Evaluation Results and Construction of each Conductive Particle as well as Metallization rate

| | Construction of Conductive Particle | | | | | | | | | | Resistance Test | |
|---|---|---|---|---|---|---|---|---|---|---|---|---|
| | Resin Particle | | | First Resin Coating | | | Thickness of First conductive thin film (μm) | Convex Portion | Thickness of Second conductive thin film (μm) | Metallization Rate (WT %) | Second Resin Coating | LCD | ITO Substrate |
| | Diameter | K Value | Breaking Strength | Thickness | K Value | Breaking Strength | | | | | | | |
| Practice Example 1 | 2 | 600 | 3.2 | 2 | 300 | 1.3 | Ni: 0.15 Au: 0.02 | 0 | Ni: 0.15 Au: 0.02 | 50 | without | ○ | ○ |
| Practice Example 2 | | | | | | | | | | | with | ○ | ○ |
| Practice Example 3 | 2 | 600 | 3.2 | 2 | 300 | 1.3 | Ni: 0.01 Au: 0.01 | 0 | Ni: 0.15 Au: 0.02 | 40 | without | ○ | ○ |
| Practice Example 4 | | | | | | | | | | | with | ○ | ○ |
| Practice Example 5 | 0.5 | 600 | 3.2 | 3 | 300 | 1.3 | Ni: 0.15 Au: 0.02 | 0 | Ni: 0.15 Au: 0.02 | 50 | without | ○ | ○ |
| Practice Example 6 | | | | | | | | | | | with | ○ | ○ |
| Practice Example 7 | 2 | 600 | 3.2 | 2 | 300 | 1.3 | Ni: 0.15 Au: 0.02 | 12 | Ni: 0.15 Au: 0.02 | 50 | without | ⊚ | ⊚ |
| Practice Example 8 | | | | | | | | | | | with | ⊚ | ⊚ |
| Practice Example 9 | 2 | 600 | 3.2 | 0.1 | 300 | 1.3 | Ni: 0.15 Au: 0.02 | 0 | Ni: 0.15 Au: 0.02 | 50 | without | ○ | ○ |
| Practice Example 10 | 2 | 600 | 3.2 | 2 | 300 | 1.3 | Ni: 0.15 Au: 0.02 | 2 | Ni: 0.15 Au: 0.02 | 50 | without | ○ | ○ |
| Practice Example 11 | 2 | 600 | 3.2 | 2 | 300 | 1.3 | Ni: 0.15 Au: 0.02 | 5 | Ni: 0.15 Au: 0.02 | 50 | without | ⊚ | ○ |
| Comparative Example 1 | 2 | 600 | 3.2 | 2 | 300 | 1.3 | Ni: 0.11 Au: 0.005 | 0 | Ni: 0.15 Au: 0.02 | 30 | without | Δ | ○ |
| Comparative Example 2 | | | | | | | | | | | with | Δ | ○ |
| Comparative Example 3 | 2 | 300 | 1.2 | 2 | 300 | 1.3 | Ni: 0.15 Au: 0.02 | 0 | Ni: 0.15 Au: 0.02 | 50 | without | Δ | ○ |
| Comparative Example 4 | | | | | | | | | | | with | × | Δ |
| Comparative Example 5 | 0.3 | 600 | 3.2 | 3 | 300 | 1.3 | Ni: 0.15 Au: 0.02 | 0 | Ni: 0.15 Au: 0.02 | 65 | without | Δ | ○ |
| | | | | | | | | | | | with | × | ○ |

TABLE 1-continued

Evaluation Results and Construction of each Conductive Particle as well as Metallization rate

| | Construction of Conductive Particle | | | | | | | | | | Resistance Test | |
|---|---|---|---|---|---|---|---|---|---|---|---|---|
| | Resin Particle | | | First Resin Coating | | | Thickness of First conductive | | Thickness of Second conductive | | Second | | ITO |
| | Diameter | K Value | Breaking Strength | Thickness | K Value | Breaking Strength | thin film (μm) | Convex Portion | thin film (μm) | Metallization Rate (WT %) | Resin Coating | LCD | Substrate |
| Comparative Example 6 | | | | | | | | | | | | | |
| Comparative Example 7 | 5 | 600 | 3.2 | — | — | — | Ni: 0.15 Au: 0.02 | 0 | — | 20 | without with | Δ Δ | ○ ○ |
| Comparative Example 8 | | | | | | | | | | | | | |
| Comparative Example 9 | 5 | 300 | 1.3 | — | — | — | Ni: 0.15 Au: 0.02 | 0 | — | 20 | without with | Δ X | ○ Δ |
| Comparative Example 10 | | | | | | | | | | | | | |
| Comparative Example 11 | 0.4 | 600 | 3.2 | 3 | 300 | 1.3 | Ni: 0.15 Au: 0.02 | 0 | Ni: 0.15 Au: 0.02 | 67 | without with | Δ Δ | ○ ○ |
| Comparative Example 12 | | | | | | | | | | | | | |

*In the above Table 1, a section "convex portion" indicates the number of convex portions (per one conductive particle) formed on the surface of the first conductive particle. Further, each unit for "diameter" and "film thickness" is μm, the unit for "K value" is kgf/mm², and the value of "breaking strength" is gf.

Comparative Examples 1 to 12 in Chart 1 are as follows.

Comparative Example 1

In this comparative example, a conductive particle was produced by means of a similar method to the practice example 1; however, in this comparative example 1, the first conductive thin film 32 was composed of a nickel coating of 0.01 μm in thickness and a gold coating of 0.005 μm in thickness.

Comparative Example 2

In this comparative example, a conductive particle was produced by means of a similar method to the practice example 2, using the conductive particle obtained by the comparative example 1.

Comparative Example 3

In this comparative example, a conductive particle was produced by means of a similar method to the practice example 1; however, in this comparative example 3, a resin particle 31 was formed of an acrylic resin that formed a second resin coating 39.

Comparative Example 4

In this comparative example, a conductive particle was produced by means of a similar method to the practice example 2, using the conductive particle obtained in the comparative example 3.

Comparative Example 5

In this comparative example, a conductive particle was produced by means of a similar method to the practice example 1; however, in this comparative example 5, the diameter of a resin particle 31 was 0.3 μm.

Comparative Example 6

In this comparative example, a conductive particle was produced by means of a similar method to the practice example 2, using the conductive resin obtained in the comparative example 5.

Comparative Example 7

In this comparative example, a conductive particle was produced by means of a similar method to the practice example 1; however, in this comparative example 7, the diameter of a resin particle 31 was 5 μm.

Comparative Example 8

In this comparative example, a conductive particle was produced by means of a similar method to practice example 2, using the conductive particle obtained in the comparative example 7.

Comparative Example 9

In this comparative example, a conductive particle was produced by means of a similar method to the practice example 1; however, in this comparative example 9, a resin particle 31 was formed of an acrylic resin that formed a first resin coating 35.

Comparative Example 10

In this comparative example, a conductive particle was produced by means of a similar method to practice example 2, using the conductive particle obtained by comparative example 9.

Comparative Example 11

In this comparative example, a conductive particle was produced by means of a similar method to the practice example 1; however, in this comparative example 11, the diameter of a resin particle is 0.4 μm and the thickness of a first resin coating 35 is 3 μm, so that a first resin coating has the thickness more than six times the resin particle.

Comparative Example 12

In this comparative example, a second resin coating was formed by means of a similar method to the practice example 2, using the conductive particle obtained in comparative example 12.

Using the above-mentioned conductive particles in Comparative Examples 1 to 12, adhesive films were respectively produced by means of a similar method to the practice example 1 in which an adhesive film was produced using the particles; and electric devices were produced in a similar manner. In other words, 12 kinds of adhesive films were produced and 12 kinds of electric devices were produced.

Then [Conductive Resistance Test] was carried out on the same condition as described above, using those electric devices.

The results of the test are written on Chart 1 made above, together with the metallization rates of the conductive particles in Comparative Examples 1 to 12.

As is obvious from Chart 1 made above, with respect to each of the conductive particles 30 and 40 in Practice Examples 1 to 8, in which the K value of a resin particle is larger than the K value of a first resin coating and also the breaking strength of a resin particle is greater than the breaking strength of a first resin coating, the result in the resistance test was superior to Comparative Examples 1 to 10, regardless of the kind of electrodes of adherends.

Accordingly, it is confirmed that if conductive particles of the present invention are used, an electric device 1 of high conductive reliability can be obtained in both the cases in which electrodes of adherends are hard or soft.

Among Comparative Examples 3, 4, 9 and 10 in which resin particles are soft and Comparative Examples 5 and 6 in which the thickness of the first resin coatings is greater than the diameter of the resin particles: the conductive resistance value was noticeably high, particularly when Comparative Examples 4, 6 and 10, in which the second resin coatings were formed, were used. It is assumed from the result that the second resin coatings were not destroyed at the time of heating and pressing, so that enough conduction between the electrodes and the metal wirings could not obtained.

As described above, the conductive particle of the present invention includes a resin particle, a first conductive thin film disposed on the surface of the resin particle, a first resin coating disposed on the surface of the first conductive thin film, and a second conductive thin film where the first resin coating is formed, and the resin particle is formed of a resin that is harder than that of the first resin coating.

With the above construction, when adherends (electrode) whose surface parts brought in contact with the conductive particle are hard are connected, the first resin coating is destroyed by pressure along with the second conductive thin film; however, the resin particle and the first conductive thin film on the surface thereof are not destroyed, and so the electrical connection between the adherends, which should be electrically connected by the first conductive thin film, has been accomplished in a favorable manner.

Further, if hard surface parts of the electrodes are formed of oxide coatings, the oxide coatings are penetrated by the first conductive thin film, so that the conductive resistance of an electric device can be lowered.

In particular, when five or more convex portions 37 are provided, the effectiveness of the penetration by the first conductive thin film can further be enhanced, thereby being able to lower the conductive resistance of an electric device.

On the other hand, if electrodes whose surface parts are soft are connected under low pressure, the first resin coating is pressed and deforms by pressure without being destroyed, so that electrical connection between adherends can be obtained by the second conductive thin film on the surface of the first resin coating.

In this manner, the conductive particle of the present invention is capable of electrically connecting and mechanically joining a variety of adherends, with the construction remaining the same.

The invention claimed is:

1. A conductive particle comprising:
   a resin particle,
   a first conductive thin film disposed around said resin particle,
   a first resin coating disposed around said first conductive thin film, and
   a second conductive thin film disposed around said first resin coating,
   wherein said resin particle is formed of a resin that is harder than said first resin coating,
   wherein said first and second conductive thin films are composed of a nickel coating, and a gold coating formed on the surface of said nickel coating.

2. A conductive particle according to claim 1, wherein the thickness of said first resin coating is 1/20 times or more and 6 times or less the diameter of said resin particle, and the thickness of said first resin coating is 0.1 μm or more.

3. A conductive particle according to claim 1, wherein the thickness of said second conductive thin film is 0.05 μm or more and 0.3 μm or less.

4. A conductive particle according to claim 1, wherein a second resin coating is formed around said second conductive thin film.

5. A conductive particle according to claim 1,
   wherein the sum of the weight of said first conductive thin film and the weight of said second conductive thin film is equal to or more that 40% of the weight of the whole of said conductive particle;
   the thickness of said first conductive thin film is 1/100 or more and 1/2 or less the diameter of said resin particle.

6. A conductive particle according to claim 1, wherein at least one convex portion is formed on the surface of said first conductive thin film on the side where said first resin coating has been disposed.

7. A conductive particle according to claim 6, wherein the average number of said convex portions formed on the surface of said first conductive thin film is five or more.

8. A conductive particle according to claim 6, wherein the average height of said convex portions formed on the surface of said first conductive thin film is 0.05 μm or more.

9. An adhesive comprising: a binder containing thermoplastic resin, and a conductive particle according to claim 1.

10. A conductive particle comprising:
    a resin particle,
    a first conductive thin film disposed around said resin particle, a first resin coating disposed around said first conductive thin film, and a second conductive thin film disposed around said first resin coating, wherein said resin particle is formed of a resin that is harder than said first resin coating, and wherein at least one convex portion is formed on the surface of said first conductive thin film on the side where said first resin coating has been disposed.

11. A conductive particle according to claim 10, wherein the average number of said convex portions formed on the surface of said first conductive thin film is five or more.

12. A conductive particle according to claim 10, wherein the average height of said convex portions formed on the surface of said first conductive thin film is 0.05 μm or more.

13. An adhesive comprising: a binder containing thermoplastic resin, and a conductive particle according to claim 10.

* * * * *